(12) United States Patent
Best

(10) Patent No.: US 10,747,468 B2
(45) Date of Patent: *Aug. 18, 2020

(54) BUFFER CIRCUIT WITH DATA BIT INVERSION

(71) Applicant: Rambus Inc., Sunnyvale, CA (US)

(72) Inventor: Scott C. Best, Palo Alto, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/543,870

(22) Filed: Aug. 19, 2019

(65) Prior Publication Data

US 2020/0042233 A1 Feb. 6, 2020

Related U.S. Application Data

(63) Continuation of application No. 16/010,664, filed on Jun. 18, 2018, now Pat. No. 10,387,075, which is a continuation of application No. 14/787,651, filed as application No. PCT/US2014/035556 on Apr. 25, 2014, now Pat. No. 10,001,948.

(60) Provisional application No. 61/822,663, filed on May 13, 2013.

(51) Int. Cl.
*G06F 3/06* (2006.01)
*G11C 7/10* (2006.01)
*G11C 5/04* (2006.01)

(52) U.S. Cl.
CPC .......... *G06F 3/0656* (2013.01); *G06F 3/0626* (2013.01); *G06F 3/0673* (2013.01); *G11C 7/1006* (2013.01); *G11C 5/04* (2013.01)

(58) Field of Classification Search
CPC .... G06F 3/0656; G06F 3/0673; G06F 3/0626; G11C 7/1006; G11C 5/04
See application file for complete search history.

(56) References Cited

U.S. PATENT DOCUMENTS

| 2007/0103996 | A1 | 5/2007 | Park |  |
|---|---|---|---|---|
| 2009/0179782 | A1 | 7/2009 | Hollis |  |
| 2011/0153939 | A1* | 6/2011 | Choi | G06F 13/1668 711/118 |
| 2011/0219197 | A1* | 9/2011 | Perego | G06F 13/1678 711/154 |

(Continued)

FOREIGN PATENT DOCUMENTS

WO WO-2013-007048 A1 1/2013

OTHER PUBLICATIONS

PCT International Search Report and Written Opinion dated Sep. 19, 2014 in International Application No. PCT/US2014/035556. 11 pages.

*Primary Examiner* — Mohammed A Bashar
(74) *Attorney, Agent, or Firm* — Lowenstein Sandler LLP

(57) ABSTRACT

A buffer circuit includes a primary interface, a secondary interface, and an encoder/decoder circuit. The primary interface is configured to communicate on an n-bit channel, wherein n parallel bits on the n-bit channel are coded using data bit inversion (DBI). The secondary interface is configured to communicate with a plurality of integrated circuit devices on a plurality of m-bit channels, each m-bit channel transmitting m parallel bits without using DBI. And the encoder/decoder circuit is configured to translate data words between the n-bit channel of the primary interface and the plurality of m-bit channels of the secondary interface.

20 Claims, 9 Drawing Sheets

(56) References Cited

U.S. PATENT DOCUMENTS

| | | |
|---|---|---|
| 2011/0222623 A1 | 9/2011 | Hollis |
| 2012/0166904 A1 | 6/2012 | Bandholz |
| 2012/0204079 A1 | 8/2012 | Takefman et al. |
| 2012/0206280 A1 | 8/2012 | Abbasfar et al. |
| 2013/0033954 A1 | 2/2013 | Shaeffer |
| 2013/0046941 A1 | 2/2013 | Ma et al. |
| 2013/0058145 A1 | 3/2013 | Yu et al. |
| 2013/0061006 A1 | 3/2013 | Hein |
| 2013/0132660 A1 | 5/2013 | Li et al. |
| 2015/0149735 A1 | 5/2015 | Nale et al. |
| 2015/0212156 A1 | 7/2015 | Bourstein |

\* cited by examiner

| Buffer Pin (module pin) | A (3) | B (148) | C (5) | D (150) | E (7) | F (8) | G (152) | H (153) | I (10) | J (155) | K (12) | L (157) |
|---|---|---|---|---|---|---|---|---|---|---|---|---|
| Normal | DQ4 | DQ5 | DQ0 | DQ1 | DQSt | DQS# | DQS# | DQS | DQ6 | DQ7 | DQ2 | DQ3 |
| DBI | same | same | same | same | DBI | N.C. | DQS# | DQS | same | same | same | same |

BUFFER CIRCUIT WITH DATA BIT INVERSION

RELATED APPLICATIONS

This application is a continuation of U.S. patent application Ser. No. 16/010,664, filed Jun. 18, 2018, now U.S. Pat. No. 10,387,075, issued Aug. 20, 2019, which is a continuation of U.S. patent application Ser. No. 14/787,651 filed Oct. 28, 2015, now U.S. Pat. No. 10,001,948, issued Jun. 19, 2018, which is a 371 application of PCT/US2014/035556, filed Apr. 25, 2014, which claims the benefit of U.S. Provisional Patent Application Ser. No. 61/822,663, filed May 13, 2013, which are hereby incorporated in its entirety herein by reference.

TECHNICAL FIELD

The present disclosure relates to a buffer circuit that supports data bit inversion (DBI).

BACKGROUND

Dynamic Random Access Memory (DRAM) is a type of memory that stores each bit of data in a separate capacitor within an integrated circuit (IC). The capacitor may be charged or discharged to represent two values of a bit. Since capacitors will slowly leak over time, the charge on the capacitor must be refreshed periodically to maintain the value of the bit hence the use of the term "dynamic." The primary memory in personal computing devices is often DRAM.

DRAM is manufactured as Integrated Circuits (ICs) bonded and mounted into packages with contacts for electrical connection to control signals and buses. In early use, DRAM ICs were installed directly to the motherboard; later, DRAM ICs were assembled into multi-chip plug-in modules, e.g., Single In-line Memory Modules (SIMMs) and Dual In-line Memory Modules (DIMMs). Both SIMMs and DIMMs comprise a series of DRAM ICs mounted on one or both sides of a printed circuit board. In contrast to SIMMs that include redundant contacts on both sides, DIMMs include distinct contacts on each side of the printed circuit board.

DIMMs may be constructed to specific standards, e.g., Rambus Dynamic Random Access Memory (RDRAM), Double Data Rate Type Two or Second Generation (DDR2), and Double Data Rate Type Three or Third Generation (DDR3), and to specific hardware systems, e.g., notebook computers, personal computers, and servers. A DIMM built for DDR2 notebook computers would be constructed according to a DDR2 200-pin SO-DIMM memory module standard, while a DIMM intended for a DDR3 server system would be built according to a DDR3 240-pin registered-DIMM standard.

In some cases, the load presented by a DIMM may adversely affect signal integrity. Load reduction is required in at least some DIMMs because each additional DIMM added into a system may degrade the integrity of the signal transmitted to other DIMMs in that memory channel, which creates a tradeoff between total system memory capacity and total system performance. By utilizing DIMMs with load reduction buffers, the electrical loading and associated degradation contributed by each DIMM is minimized, thereby enabling the installation of several DIMMs per memory channel without significant degradation in performance.

BRIEF DRAWINGS DESCRIPTION

The present disclosure describes various embodiments that may be understood and fully appreciated in conjunction with the following drawings.

FIG. 6 is an embodiment of a pinout table for the DIMM shown in FIGS. 4 and 5.

DETAILED DESCRIPTION

Figure 1:
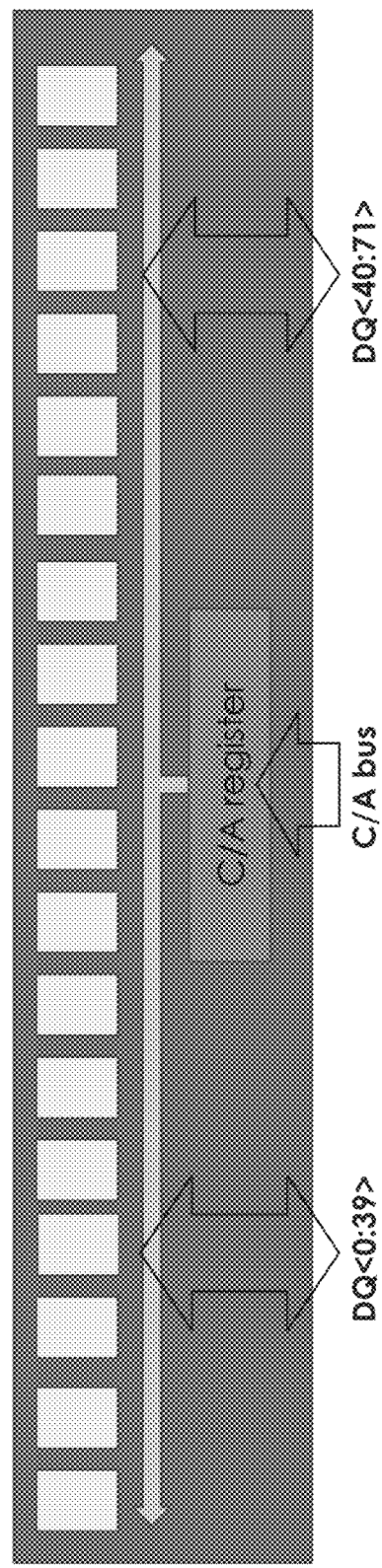
FIG. 1 is a diagram of an embodiment of a DIMM with a command/address bus register.

The present disclosure describes embodiments with reference to the drawing figures listed above. Persons of ordinary skill in the art will appreciate that the description and figures illustrate rather than limit the disclosure and that in general the figures are not drawn to scale for clarity of presentation. Such skilled persons will also realize that many more embodiments are possible by applying the inventive principles contained herein and that such embodiments fall within the scope of the disclosure which is not to be limited except by the claims.

Figure 2:
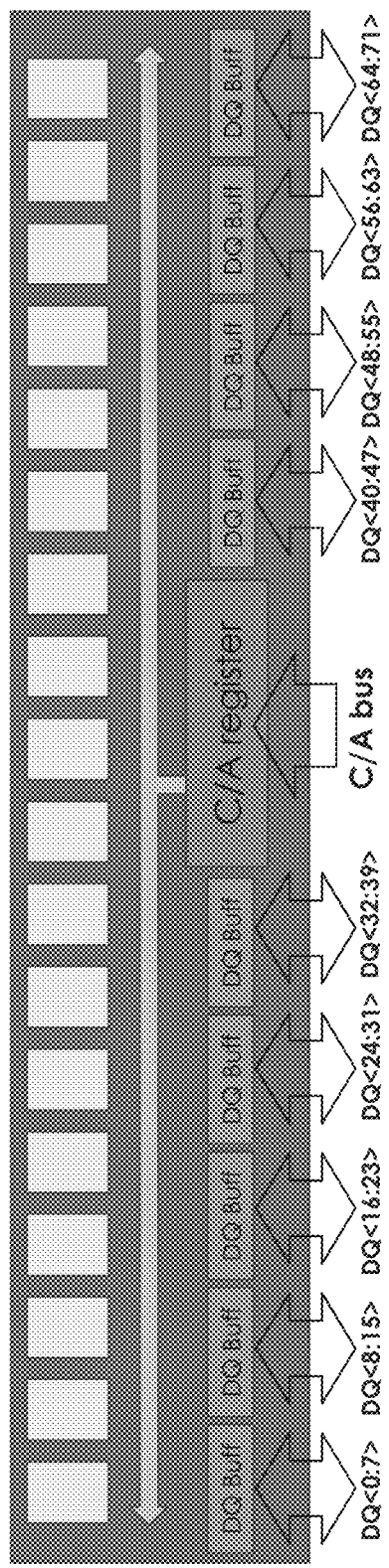
FIG. 2 is a diagram of an embodiment of a DIMM with a command/address bus register and per byte data bus buffers.

Referring to FIGS. 1 and 2, an embodiment of a DIMM 100 includes a 72-pin data path DQ<0:71> and a plurality of DRAMs 102 electrically coupled to a controller (not shown) over data bus 104A communicating a first group of data signals DQ<0:39>, a data bus 106 communicating a first group of command/address (C/A) signals, and data bus 104B communicating a second group of data signals DQ<40:71>. An embodiment of a DIMM 200 includes a 72-bit data path DQ<0:71> and a plurality of DRAMs 202 electrically coupled to a controller (not shown) over data buses 204A-204I communicating data signals DQ<0:71>. C/A registers 108 and 208 buffer C/A signals over C/A buses 106 and 206 to DRAMs 102 and 202 on DIMMs 100 and 200, respectively. C/A registers 108 and 208 reduce or minimize the load presented by the DRAMs 102 and 202 on the C/A buses 106 and 206 to a controller (not shown). Instead of DIMMs 100 and 200 presenting a load equivalent to that of the plurality of DRAMs 102 and 202, respectively, DIMMs 100 and 200 only present a load equivalent to that of C/A registers 108 and 208 on the buses 106 and 206, respectively.

With regard to data signals DQ<0:71>, however, DIMM 100 presents a load to the connected DQ lines for each memory rank on the DIMM (although one rank is shown for clarity, multiple ranks are typically used on each DIMM), which may adversely affect signal quality. DIMM 200, on the other hand, comprises a plurality of per-byte data signal buffers 204A to 204I that reduce the load presented by the DRAMs 202 on the DQ bus to the controller to one load, despite multiple ranks existing behind the buffers, and minimize attendant signal degradation. Data signal buffers 204A to 204I, therefore, enable installation of several DIMMs per memory channel to increase capacity without significantly degrading performance at the expense of increasing power consumption. In common industry terms, this type of memory module is known as a "Load Reduced DIMM" or "LR-DIMM."

Figures 3A, 3B:
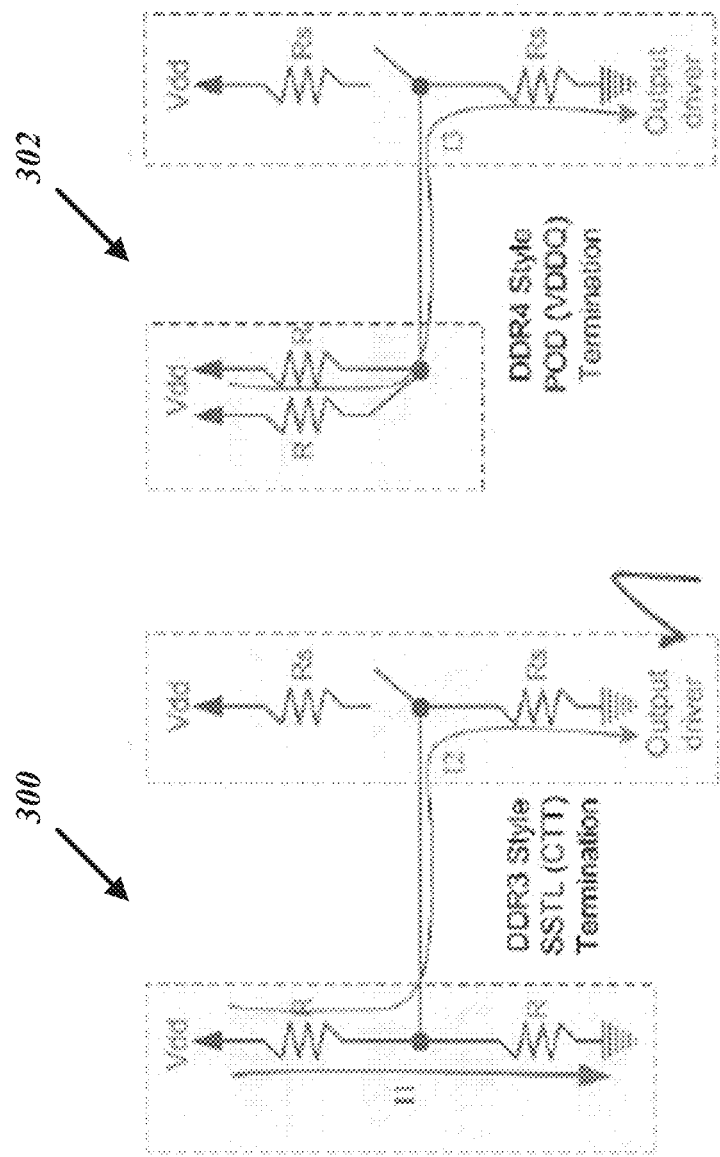
FIG. 3A is a circuit diagram of SSTL data signaling used in the DDR3 specification.
FIG. 3B is a circuit diagram of POD data signaling used in the DDR4 specification.

The desire to extend the battery life in the use of mobile and other computing devices and to reduce power consumption in systems in general results in a constant push to improve the power consumed by components included within the computing devices, including memory. In terms of power consumption, DDR3 memory uses substantially less power than DDR2 memory. Even so, DDR3 memory includes Stub Series Terminated Logic (SSTL) signaling that consumes power when it transmits both high and low electrical states. FIG. 3A is a diagram of a DDR3 circuit 300, in which SSTL signaling incurs a drive current I2 as well as a current I1 due to the Center Tapped Termination (CTT) nature. In contrast, FIG. 3B is a diagram of a Double Data Rate Fourth Type or Fourth Generation (DDR4) circuit 302, in which Pseudo-Open Drain (POD) signaling incurs no DC current flow in the case of driving a high electrical state. Additionally, the DDR4 specification reduced the DRAM I/O voltage (VDDQ) from 1.35 volts to 1.2 volts. Collectively, the change from SSTL signaling to POD signaling and the reduced VDDQ voltage requirements contribute to significant reductions in power consumption for DDR4 memory when compared to DDR3 memory.

Data Bit Inversion (DBI) is a further power saving technique that was added to the DDR4 specification. DBI is also referred to as Data Bus Inversion, Dynamic Bit Inversion, or Dynamic Bus Inversion.

DBI is principally useful when a first of two electrical states being transmitted across a bus consumes substantially less current than a second of the two electrical states, although it is also useful for reducing AC power consumption. Thus DBI is useful with the POD signaling used by the DDR4 specification. To make use of DBI, a 9th bit is added to every 8-bit data byte. For example, in a 72-bit DDR4 bus, the DDR4 specification calls for an additional nine 1-bit DBI signals, one 1-bit DBI signal assigned to each 8-bit byte in the 72-bit bus. A first of two encoding states is chosen for the 9 bits of information based on which of the two states consumes less power. For example, if the 9 bits being transmitting would consume less power in the aggregate if the 8 data bits were inverted and DBI asserted, the 8 data bits are inverted and the DBI bit is set active or enabled; otherwise, the 8 data bits are transmitted without intervening inversion and the DBI bit is set inactive or disabled.

In some cases, the figures omit some of the signals described in the DDR3 and DDR4 specification for simplicity. For example, FIGS. 1, 2, 4, and 5 omit strobe signals that are described in the DDR3 and DDR4 specification to focus on the operation of DBI.

Figure 4:
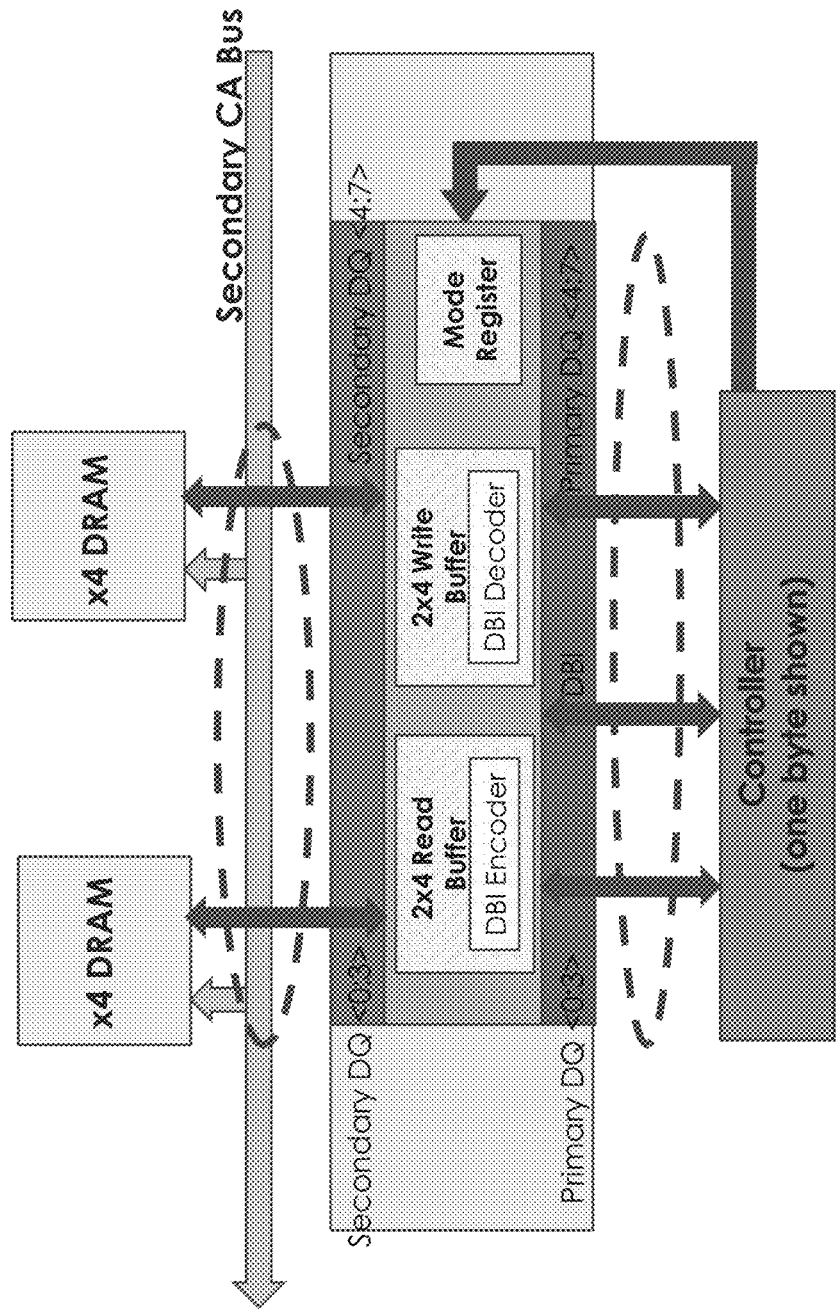
FIG. 4 is a diagram of an embodiment of one byte lane of a DIMM according to the present disclosure.

Referring to FIG. 4, an embodiment of one byte lane 400 of a DIMM includes a plurality of DRAMs 402 electrically coupled to a controller 401 through a buffer circuit 403. Note that FIG. 4 shows only a portion of a DIMM for expediency and clarity and is not intended to be limiting in any way. In an embodiment, each of DRAMs 402 are x4 ("by 4" or 4-bit) devices, meaning that the external data interface to each DRAM 402 is 4-data-bits wide e.g., <DQ0-DQ3>. Note that DBI cannot be directly utilized by the x4 DRAMs 402, as the type of DBI supported by the DDR4 specification requires an x8 data signal group, and thus such x4 DRAMs may not have any provision for DBI at all. Controller 401 may be any type of memory controller or other integrated circuit having memory control functionality (the most common being microprocessors and "buffer-on-board" memory expanders) as is well known to a person of ordinary skill in the art. Note that most modern memory controllers that interface with DIMMs can be configured to work with DRAMs of either x4 or x8 signal width.

Buffer circuit 403 may communicate with controller 401 through a primary interface 404 on channel 414 using primary data buses 424A and 424B. During a read operation, primary data bus 424A may transmit a first n-bit data group DQ<0:3> while primary data bus 424B may transmit a second n-bit data group DQ<4:7> from read buffer 403A to controller 401 over n-bit channel 414 coded with DBI functionality. Encoder 407A may substantially simultaneously transmit DBI bit 417 encoded using DBI to controller 401. Although n may be any integer, in an embodiment, n may be nine (9) parallel bits such that primary bus 424A transmits 4-bit (potentially inverted) data group DQ<0:3>, primary bus 424B transmits 4-bit (potentially inverted) data group DQ<4:7>, and encoder 407A transmits additional DBI bit 417 that indicates whether the data on bus 424A and bus 424B is inverted for a given data bit time.

Buffer circuit 403 may communicate with DRAMs 402 through a secondary interface 405 on channel 415 using secondary data buses 425A and 425B. Secondary data bus 425A may transmit to DRAMs 402 a first 4-bit data group DQ<0:3> while secondary data bus 425B may transmit a second 4-bit data group DQ<4:7>. As DRAMs 402 that interface with data buses 425A and 425B input and output data that is 4 data bits in width, the buses 425A and 425B are not coded with DBI functionality (as mentioned earlier, the DDR4 specification includes DBI functionality only for DRAMs of x8 width, but not for DRAMs of x4 width).

Similarly, decoder 407B may receive DBI-coded n-bit data DQ<0:3> and DQ<4:7> from controller 401 and decode the n-bit data into two m-bit groups for respective transmission to DRAMs 402.

Channel 415 during a write operation may substantially simultaneously transmit m parallel bits of data from buffer circuit 403, split between DRAMs 402. Although m be any integer, in an embodiment, m is eight (8) parallel bits such that secondary bus 425A transmits 4-bit data group DQ<0:3> and secondary bus 425B transmits 4-bit data group DQ<4:7> to the respective DRAMs 402.

In many instances, total memory capacity is a key metric. In an embodiment, the data interface of each of DRAMs 402 is only 4-bits wide (i.e., a x4 DRAM), thus increasing the number of DRAM devices within each 72-bit rank compared to DIMM embodiments with wider data interface DRAMs. Doing so increases the overall storage capacity of the DIMM: eighteen x4 DRAMs on a 72-bit DIMM provide twice as much capacity as nine x8 DRAMs (of the same per-chip density). According to convention, however, using DRAMs 402 that have 4-bit data width (x4) cannot realize the benefits of DBI, since each DRAM 402 is only four bits wide, and the typical 8:9 DBI coding specified by the DDR4 specification requires a minimum of 8 bits of data. The DDR4 specification recognizes that DBI functionality is not an available option for use on x4 DRAM memory devices.

An embodiment of a DIMM according to the present disclosure addresses the lack of DBI functionality when using x4 DRAMs 402 by including an encoder circuit 407A as part of the read buffer 403A and a decoder circuit 407B as part of write buffer 403B. Encoder 407A and decoder 407B are configured to translate data words between channel 414 of primary interface 404 and groups of m-bit channels 415 of secondary interface 405. Encoder 407A and decoder 407B implement DBI functionality within primary interface 404 even though DBI functionality is not available on secondary interface 405. Thus, in a number of embodiments, DBI functionality is implemented in primary interface 404, even though secondary interface 405 does not support the use of DBI (or at least is operable in a mode that omits DBI support).

Encoder 407A combines 4-bit data groups DQ<0:3> and DQ<4:7> from secondary buses 425A and 425B into an 8-bit data group DQ<0:7> plus DBI bit 417. Since buffer circuit 403 obtains a byte of data from secondary buses 425A and 425B over secondary channel 415, buffer circuit 403 may provide DBI functionality to controller 401 over primary channel 414 even though DRAMs 402 may not be an available option due to their x4 data width.

During a read operation when primary interface 404 transmits data to controller 401 over primary buses 424A and 424B, read buffer 403A may use encoder circuit 407A to DBI encode a single n-bit data signal (9 data bits comprising an 8-bit data byte plus DBI bit 417; 11 total signals including the true and complement strobe signals that are not shown) based on two non-DBI-encoded m-bit data signals (4 bits each; 12 total signals including true and complement strobe signals from each DRAM 402 that are not shown) that are then received from two DRAMs 402 over secondary interface 405 using secondary buses 425A and 425B. Similarly, on a write operation when primary interface 404 is receiving data from controller 401 over primary buses 424A and 424B, write buffer 403B may use decoder circuit 407B to decode a single DBI-encoded n-bit data signal (9 data bits comprising an 8-bit data byte plus DBI bit 417; 11 total signals including the true and complement strobe signals that are not shown) into two m-bit non-DBI-encoded data signals (4 bits each; 12 total signals including true and complement strobe signals to each DRAM 402 that are not shown) that are then transmitted to two DRAMs 402 over secondary interface 405 using secondary buses 425A and 425B. By so using buffer circuit 403, DIMM byte lane 400 combines load reduction benefits associated with buffering DRAMs 402 with power saving benefits of DBI, while taking advantage of the high capacity benefits associated with using DRAMs having a x4 data width.

In an embodiment, buffer circuit 403 may include a programmable mode register 409 configured to enable buffer circuit 403 to selectively encode/decode DBI functionality (e.g., to save power when controller 401 enables DBI support, while providing non-DBI mode as well). Programmable mode register 409 may additionally include a bit field to enable DBI functionality in secondary interface 405 and thus operate in DBI mode when DRAMs 402 include a 9-bit interface to support DBI (e.g., when DRAMs 402 are x8 or x16) or to disable DBI functionality when DRAMs 402 do not support a 9-bit DBI interface (e.g., when DRAMs 402 are x4 or narrower). Programmable mode register 409 may also include functionality for two independent modes: to provide DBI encoding on reads (using encoder 407A) and/or DBI decoding on writes (using decoder 407B), rather than a single mode of DBI encoding/decoding for both read and write operations. In some embodiments, read and write DBI functionality may be independently specified for both the primary and the secondary interface, e.g., such that a x8 DIMM can support DBI on its secondary side independent of whether a connected controller enables such mode on the primary side. Encoder 407A and decoder 407B may be a single encoder/decoder circuit or distinct circuits as shown, and may be unidirectional or bidirectional.

Figure 5:
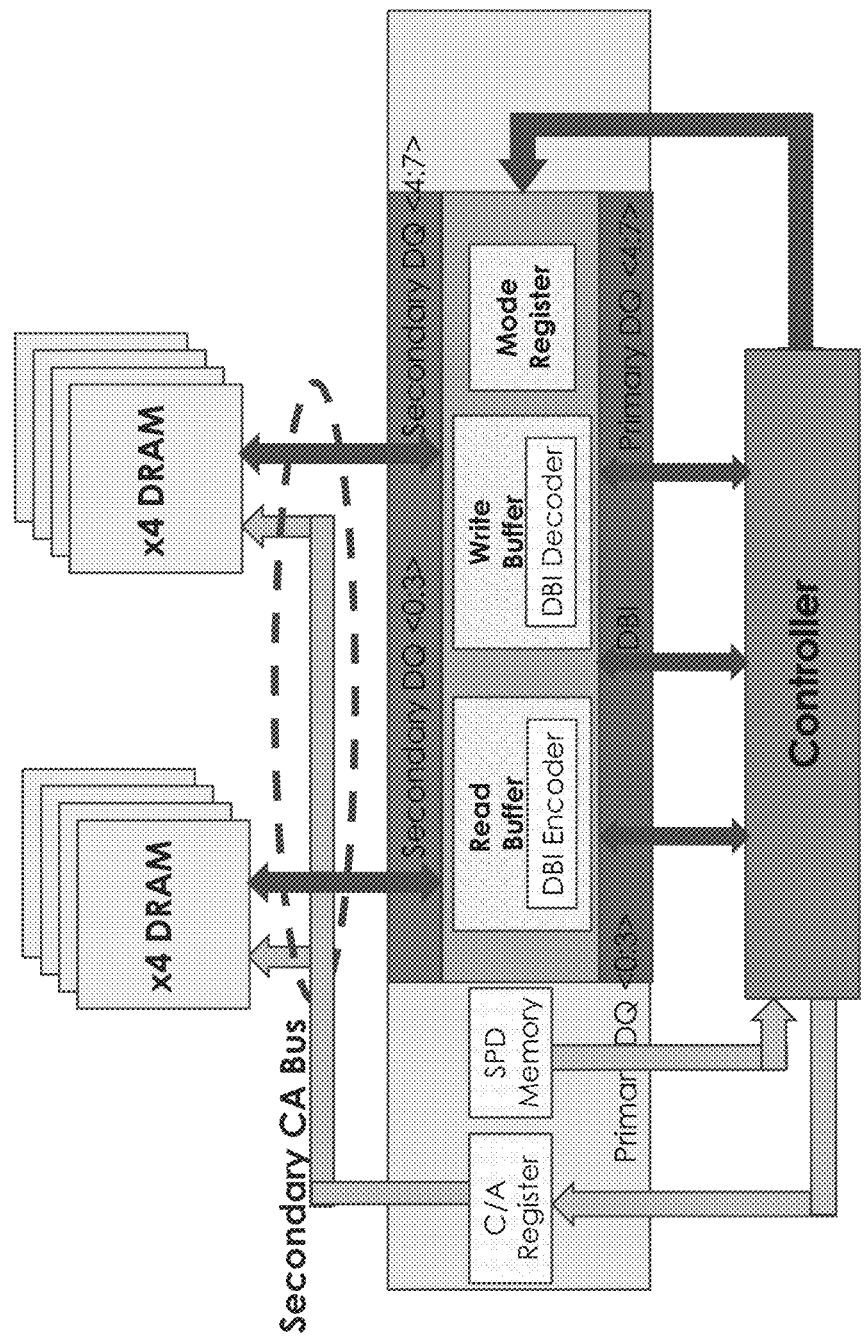
FIG. 5 is a diagram of an embodiment of a DIMM according to the present disclosure.

Referring to FIG. 5, an embodiment of a DIMM 500 includes a plurality of ranks of DRAMs 502 electrically coupled to a controller 501 through a per-byte buffer circuit 503 including read buffer 503A and write buffer 503B. DIMM 500 also includes a C/A register 511 and a Serial Detect Presence (SPD) memory 508. Note that DIMM 500 shows only one byte lane of data for purposes of illustration; typical DDR4 DIMMs may have 4, 8, or 9 byte lanes. Note also that DIMM 500 shows four ranks of DRAM (i.e., four DRAMS 502 in parallel, e.g., connecting to the same interface pins of buffer 503, although other arrangements are possible); typical DDR4 DIMMs may have 1, 2, 4, or 8 ranks per DIMM.

SPD memory 508 may store the configuration or settings of DIMM 500. SPD memory 508 may be any type of memory including Electrically Erasable Programmable Read Only Memory (EEPROM) and may have any size appropriate for the application, e.g., four blocks of 128 bytes each. SPD memory 508 may store specific settings in specific addresses that are defined by a DDR4 module specification. For example, byte 3 may contain "0001" in the lower 4 bits if the module is a registered module or may contain "0100" if the module is a load reduced module, e.g., DIMM 500. Similarly, byte 12 may contain "000" in the lower 3 bits if the module is constructed using 4-bit wide DRAMs or may contain "001" if the module is alternatively constructed using 8-bit wide DRAMs. In an embodiment, DIMM 500 with buffer circuit 503 may include "001" in byte 12, even though DRAMs 502 themselves are 4 bits wide. Alternatively, SPD memory 508 may contain a reserved value, e.g., "101," to indicate to controller 501 that DIMM 500 optionally supports DBI functionality. Using a reserved value in SPD memory 508 may necessitate a change to the existing standard governing such communications.

Once controller 501 configures DIMM 500 to operate in x8 mode, controller 501 further may configure buffer circuit 503 of DIMM 500 to operate in DBI mode for both read and write operations. That is, although some memory modules can support DBI functionality, the DBI functionality may not necessarily be active for read and write operations by default. To activate DBI functionality, controller 501 may transmit a Mode Register Set (MRS) command to C/A register 511 of DIMM 500. Controller 501 may generally transmit MRS commands to configure several optional modes. More specifically, controller 501 may transmit an MRS command to C/A register 511 to activate DBI functionality on DRAMs 502. For example, controller 501 may transmit an MRS command with a mode register select value set to 5, i.e., "101," the address bit A11 set to "1" enables DBI during a write operation and the address bit A12 set to "1" enables DBI during a read operation. For DBI functionality to be operational, address bit A10, which determines whether the ninth signal bit contains DBI information or data mask information, is set to "0."

Generally, C/A register 511 directly relays MRS commands received from controller 501 to DRAMs 502 without intervention. To implement the DBI functionality of the present disclosure, the direct relay may change. In an embodiment of DIMM 500, command/address register 511 intercepts MRS commands with mode register select values set to 5, e.g., "101." By doing so, DIMM 500 may avoid unexpected behavior from DRAMs 502 when the DBI mode is active (since DBI functionality is specific to x8 DRAMs). In an embodiment, C/A register 511 may intercept an MRS command with mode register select value set to five and instead of relaying an address bit A11 or address bit A12 set to "1" (to enable DBI functionality), C/A register 511 will relay instead a "0" over secondary interface 505. At substantially the same time, command/address register 511 may transmit a configuration signal to buffer circuit 503 to activate DBI functionality during a read operation, a write operation, or both based at least on the value of address bits A11 and A12 received on the primary interface 504.

In another embodiment, the MRS command protocol may be extended to allow memory controller 501 to directly activate DBI functionality during a read operation, a write operation, or both, without affecting the DRAMs 502 and without the need for C/A register 511 to intercept MRS commands. Such changes to the MRS command protocol may require an update to the applicable standard or they may alternatively require using reserved MRS address space currently optionally used for configuring buffer circuit in memory modules. In an alternative embodiment, configuring DIMM 500 may be accomplished using the I2C bus (not shown) that is often available alongside MRS commands.

In an embodiment, DIMM 500 may include memory devices other than DRAMs 502 including flash memory, static random access memory (SRAM), and others that may employ the DBI power-saving functionality on one or the other, but not necessarily both, of a controller side or primary interface and a memory side or secondary interface. In an embodiment, the techniques may be employed in memory systems that lack discrete memory modules e.g., where the memory control integrated circuit, buffer chip, and/or memory components are integrated within a system on chip, multi-chip module, three-dimensional IC, package-in-package, package-on-package and so forth.

A table 600 shows a portion of the DDR4 pinout for DIMM 500 including DBI functionality. Referring to FIG. 6, DIMM 500 may include a byte lane 400 (shown in FIG. 4) with buffer circuit 503 including twelve pins, labeled as A through L in row 1 of table 600. DIMM 500 will include the pinout shown in row 2 in a non-DBI mode. In a DBI mode, the pin definitions change in response to whether the module uses x4 or x8 DRAMs. As shown in row 3 of table 600:
 pins A-D or I-L (DQ) do not change definition;
 pins E and F change from strobe signals DQSH and DQSH # (higher nibble) to DBI and no connect pins; and
 pins G and H change from strobe signals DQSL and DQSL # (lower nibble) to the true/complement strobe reference DQS # and DQS for the whole byte (rather than just the lower nibble).

Figure 7:
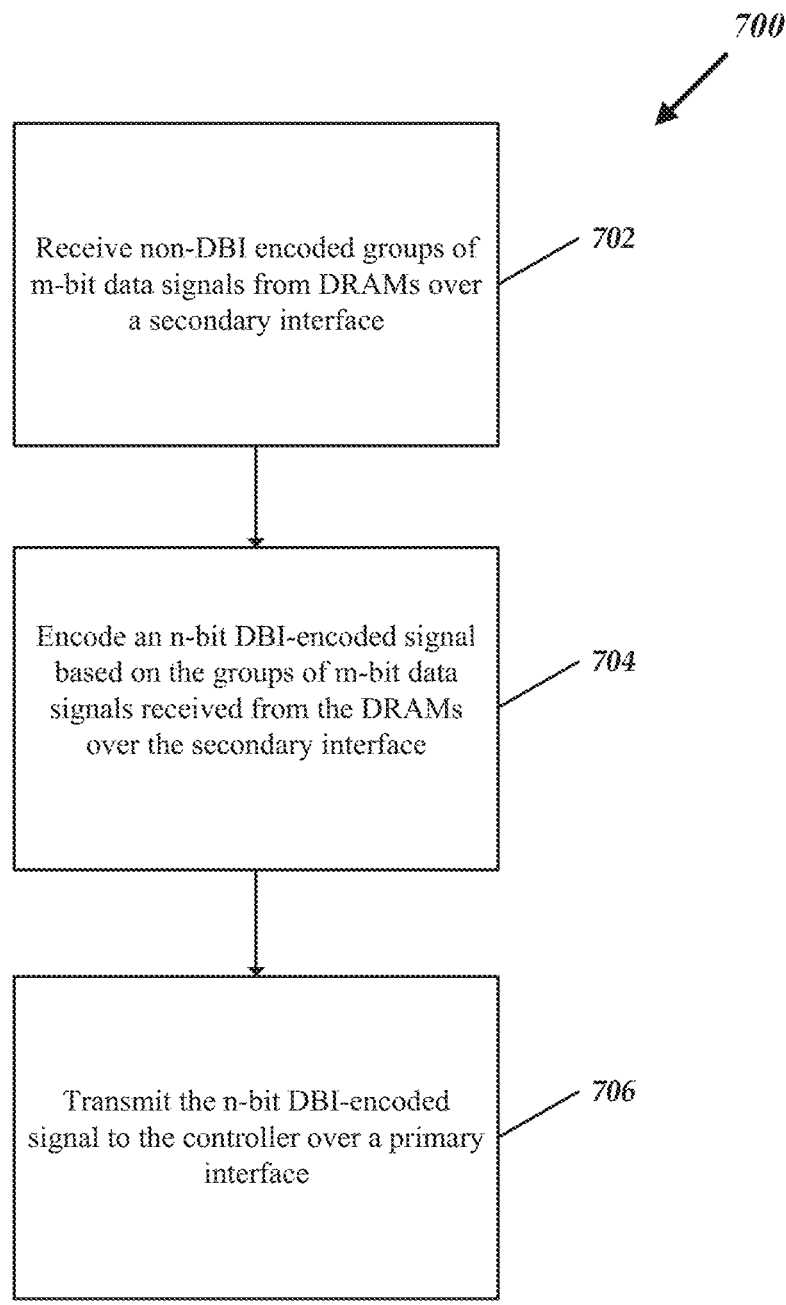
FIG. 7 is a flowchart of an embodiment of a method for operating a buffer circuit on the DIMM shown in FIGS. 4 and 5 during a read operation.

An embodiment of a method 700 of operating a buffer circuit on DIMM 500 during a read operation is shown in FIG. 7. At 702, the method 700 includes receiving non-DBI encoded groups of m-bit data signals from DRAMs over a secondary interface. The method 700 further includes, at 704, encoding, using an encoder circuit, an n-bit DBI-encoded signal based on the groups of m-bit data signals received from the DRAMs over the secondary interface and, at 706, transmitting the n-bit DBI-encoded signal to the controller over a primary interface.

Figure 8:
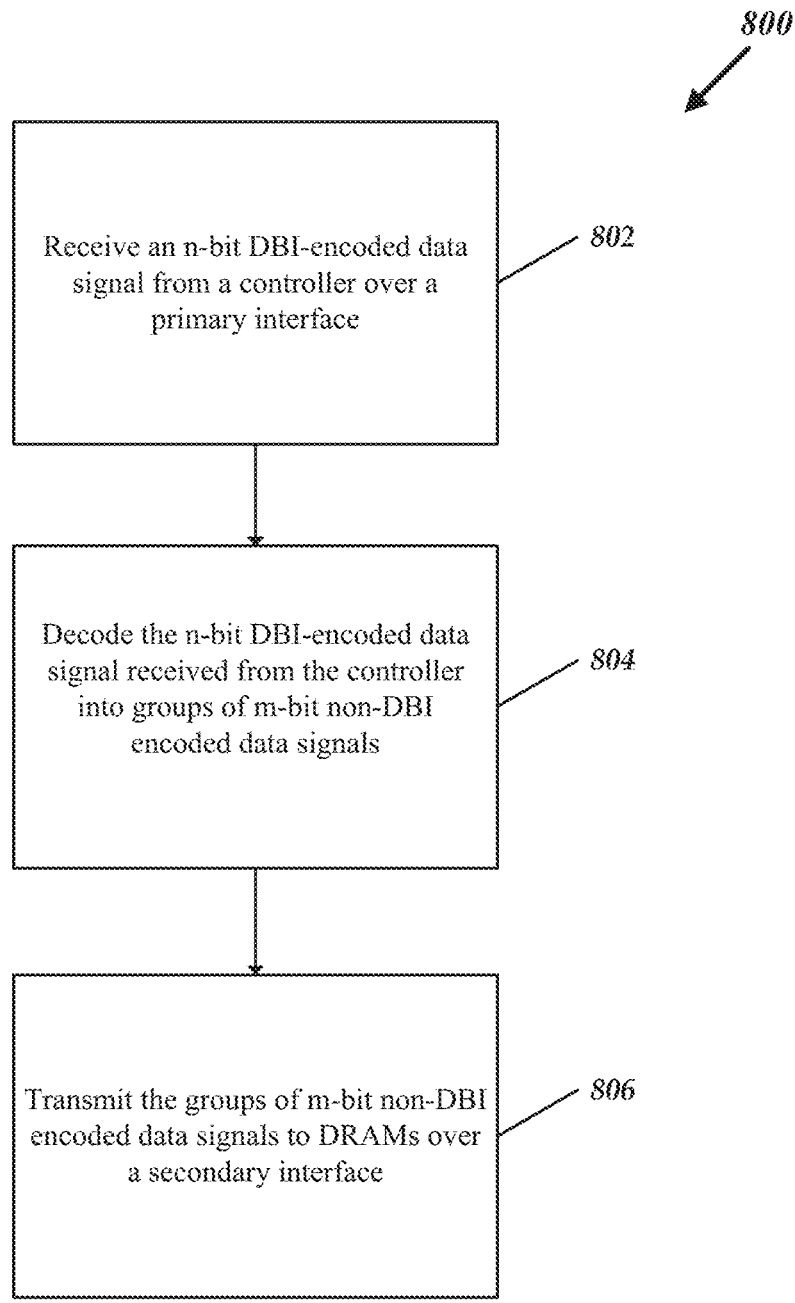
FIG. 8 is a flowchart of an embodiment of a method for operating a buffer circuit on the DIMM shown in FIGS. 4 and 5 during a write operation.

An embodiment of a method 800 of operating a buffer circuit on DIMM 500 during a write operation is shown in FIG. 8. At 802, the method 800 includes receiving an n-bit DBI-encoded data signal from a controller over a primary interface. The method 800 further includes, at 804, decoding, using a decoder circuit, the n-bit DBI-encoded data signal received from the controller into groups of m-bit non-DBI encoded data signals and, at 806, transmitting the groups of m-bit non-DBI encoded data signals to DRAMs over a secondary interface.

Figure 9:
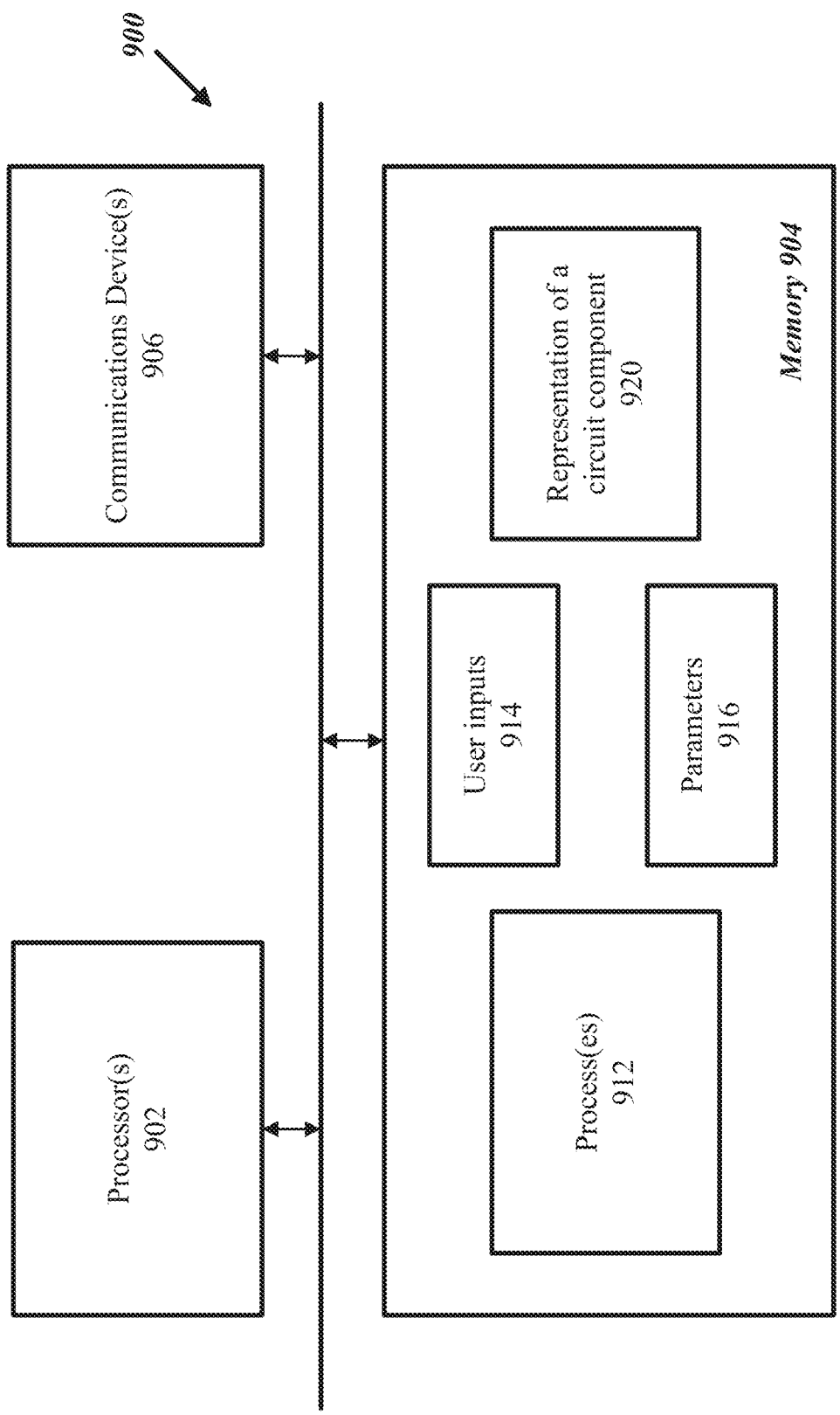
FIG. 9 is a block diagram illustrating one embodiment of a processing system for processing or generating a representation of a circuit component.

FIG. 9 is a block diagram illustrating one embodiment of a processing system 900 for processing or generating a representation of a circuit component 920. Processing system 900 includes one or more processors 902, a memory 904, and one or more communications devices 906. Processors 902, memory 904, and communications devices 906 communicate using any suitable type, number, and/or configuration of wired and/or wireless connections 908.

Processors 902 execute instructions of one or more processes 912 stored in a memory 904 to generate and/or process representation 920 in response to user inputs 914 and parameters 916. Processes 912 may be any suitable type, number, and/or configuration of electronic design automation (EDA) tools or portions thereof used to design, simulate, analyze, and/or verify electronic circuitry and/or prepare electronic circuitry for manufacturing (e.g., by generating one or more representations 920 used to create one or more photomasks). Representation 920 includes data that describes all or selected portions of buffer circuits 403 and 503 as shown in FIGS. 4 and 5 in any suitable format. Examples of such formats include a netlist, a hardware description language format, a field-programmable gate array bitstream, a library format, a simulation format, and a physical design (e.g., a layout or computer-aided design (CAD) file) format. In some embodiments, one or more processes 912, when executed by processors 902, may access a representation 920 of a first type, convert the representation 920 to a second type, and store the second type of representation in memory 904 or another suitable memory (not shown) via communications devices 906.

Memory 904 includes any suitable type, number, and/or configuration of non-transitory computer-readable storage media that store processes 912, user inputs 914, parameters 916, and representation 920. User inputs 914 may be received from any suitable source such as a keyboard, a mouse, and/or a touchscreen. Parameters 916 may include electronic circuit libraries, design policies, process rules, and/or other information used by one or more processes 912 to generate and/or process representation 920.

Communications devices 906 include any suitable type, number, and/or configuration of wired and/or wireless devices that transmit information from processing system 900 to another processing or storage system (not shown) and/or receive information from another processing or storage system (not shown). For example, communications devices 906 may transmit representation 920 to another system (not shown). Communications devices 906 may also receive processes 912, user inputs 914, parameters 916, and/or circuit component 920 from another system (not shown) and cause processes 912, user inputs 914, parameters 916, and/or circuit component 920 to be stored in memory 904.

A person of ordinary skill in the art will recognize that they may make many changes to the details of the above-described memory device without departing from the underlying principles. The scope of the present disclosure includes both combinations and sub-combinations of the various features described hereinabove as well as modifications and variations which would occur to such skilled persons upon reading the foregoing description. Only the following claims, however, define the scope of the memory device.

The invention claimed is:

1. A memory controller comprising:
a first interface to receive configuration information associated with a memory module, the configuration information indicating a width of dynamic random access memory (DRAM) devices disposed on the memory module;
a second interface to send a first mode register set (MRS) command to a buffer circuit, the MRS command to specify whether to activate data bit inversion (DBI) functionality for the memory module based on the configuration information;
a data interface to transmit a plurality of data bits to the buffer circuit; and
a DBI interface to transmit a DBI bit to the buffer circuit, the DBI bit indicating whether the plurality of data bits are inverted.

2. The memory controller of claim 1, wherein the configuration information comprises Serial Presence Detect (SPD) information received from a SPD memory in the memory module.

3. The memory controller of claim 1, wherein the configuration information further comprises an indication of whether the memory module supports the DBI functionality.

4. The memory controller of claim 1, wherein the memory module comprises a dual in-line memory module (DIMM).

5. The memory controller of claim 4, wherein the configuration information further comprises an indication of whether the DIMM is a registered module or a load reduced module.

6. The memory controller of claim 4, wherein the second interface of the memory controller further to:
send a command to configure the DIMM to operate in an 8-bit wide mode.

7. The memory controller of claim 1, wherein the second interface of the memory controller further to:
send the MRS command to a command/address register in the memory module.

8. The memory controller of claim 1, wherein the second interface of the memory controller further to:
send the MRS command to the buffer circuit and bypass a command/address register in the buffer circuit.

9. The memory controller of claim 1, wherein the second interface of the memory controller further to:
send a second MRS command to the buffer circuit to deactivate the DBI functionality for the memory module.

10. A method of operation of a memory controller comprising:
receiving, by the memory controller, configuration information associated with a memory module, the configuration information indicating a width of dynamic random access memory (DRAM) devices disposed on the memory module; and
sending, by the memory controller, a first mode register set (MRS) command to a buffer circuit of the memory module, the MRS command to specify whether to activate data bit inversion (DBI) functionality for the memory module based on the configuration information;
transmitting a plurality of data bits to the buffer circuit; and
transmitting a DBI bit to the buffer circuit, the DBI bit indicating whether the plurality of data bits are inverted.

11. The method of claim 10, wherein receiving the configuration information comprises receiving Serial Presence Detect (SPD) information from a SPD memory in the memory module.

12. The method of claim 10, wherein receiving the configuration information comprises receiving an indication of whether the memory module supports the DBI functionality.

13. The method of claim 10, wherein the memory module comprises a dual in-line memory module (DIMM).

14. The method of claim 13, wherein receiving the configuration information further comprises receiving an indication of whether the DIMM is a registered module or a load reduced module.

15. The method of claim 13, further comprising:
sending a command to configure the DIMM to operate in an 8-bit wide mode.

16. The method of claim 10, further comprising:
sending the MRS command to a command/address register in the memory module.

17. The method of claim 10, further comprising:
sending the MRS command to the buffer circuit and bypassing a command/address register in the buffer circuit.

18. The method of claim 10, further comprising:
sending a second MRS command to the buffer circuit to deactivate the DBI functionality for the memory module.

19. A memory controller comprising:
a first interface to receive, from a memory module, configuration information indicating a width of a memory device disposed on the memory module;
a second interface to send, to the memory module, a first mode register set (MRS) command activating data bit inversion (DBI) functionality for the memory module based on the configuration information;
a data interface to transmit, to the memory module, a plurality of data bits to be stored in the memory device; and
a DBI interface to transmit, to the memory module, a DBI bit indicating whether the plurality of data bits are inverted.

20. The memory controller of claim 19, wherein the second interface of the memory controller further to:
send, to the memory module, a second MRS command deactivating the DBI functionality for the memory module.

* * * * *